United States Patent
Taya et al.

(10) Patent No.: US 10,438,831 B2
(45) Date of Patent: Oct. 8, 2019

(54) BASE FILM FOR DICING SHEETS AND DICING SHEET

(71) Applicant: LINTEC CORPORATION, Tokyo (JP)

(72) Inventors: Naoki Taya, Tokyo (JP); Yuki Nito, Tokyo (JP); Yusuke Miyatake, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 83 days.

(21) Appl. No.: 15/318,383

(22) PCT Filed: Jun. 18, 2014

(86) PCT No.: PCT/JP2014/066140
§ 371 (c)(1),
(2) Date: Dec. 13, 2016

(87) PCT Pub. No.: WO2015/193990
PCT Pub. Date: Dec. 23, 2015

(65) Prior Publication Data
US 2017/0121569 A1 May 4, 2017

(51) Int. Cl.
*H01L 21/683* (2006.01)
*B32B 27/30* (2006.01)
(Continued)

(52) U.S. Cl.
CPC ............ *H01L 21/6836* (2013.01); *B32B 7/12* (2013.01); *B32B 27/06* (2013.01); *B32B 27/308* (2013.01);
(Continued)

(58) Field of Classification Search
CPC ... H01L 21/301; H01L 21/304; H01L 21/683; B32B 27/30; B32B 27/302;
(Continued)

(56) References Cited

U.S. PATENT DOCUMENTS 6,479,138 B1 * 11/2002 Childress ................ B32B 27/28
428/213
6,506,490 B1 1/2003 Yamamoto
(Continued)

FOREIGN PATENT DOCUMENTS

EP 3125276 A1 2/2017
JP H05-211234 A 8/1993
(Continued)

OTHER PUBLICATIONS

Machine translation of JP 2017/063210 A (counterpart to WO 2013/099778 A1), obtained from J-PlatPat service of the JPO on Nov. 2, 2018.*
(Continued)

*Primary Examiner* — Z. Jim Yang
(74) *Attorney, Agent, or Firm* — Posz Law Group, PLC (57) ABSTRACT

A base film for dicing sheets that is used in a dicing sheet comprising the base film and a pressure sensitive adhesive layer laminated on one surface of the base film. The base film comprises at least a first resin layer that is in contact with the pressure sensitive adhesive layer of the dicing sheet and a second resin layer that comes into contact with the first resin layer when the base film for dicing sheets is wound up. The second resin layer has a crystallinity of 28% to 45%. The ratio of a tensile elastic modulus of the first resin layer to a tensile elastic modulus of the second resin layer is 1.2 to 3.0. The ratio of a thickness of the first resin layer to a thickness of the base film for dicing sheets is 25% to 80%.

17 Claims, 1 Drawing Sheet

(51) Int. Cl.
  *B32B 27/32* (2006.01)
  *B32B 7/12* (2006.01)
  *B32B 27/06* (2006.01)
  *C08L 23/08* (2006.01)
  *C09J 7/29* (2018.01)

(52) U.S. Cl.
  CPC .......... *B32B 27/32* (2013.01); *C08L 23/0869* (2013.01); *C09J 7/29* (2018.01); *H01L 21/6835* (2013.01); *B32B 2307/54* (2013.01); *C09J 2201/122* (2013.01); *C09J 2201/162* (2013.01); *C09J 2201/606* (2013.01); *C09J 2201/622* (2013.01); *C09J 2203/326* (2013.01); *C09J 2205/114* (2013.01); *C09J 2421/006* (2013.01); *C09J 2423/006* (2013.01); *C09J 2423/046* (2013.01); *C09J 2423/106* (2013.01); *C09J 2429/006* (2013.01); *C09J 2431/006* (2013.01); *C09J 2433/00* (2013.01); *C09J 2433/006* (2013.01); *H01L 2221/68327* (2013.01)

(58) Field of Classification Search
  CPC ... B32B 27/308; B32B 27/32; C08L 23/0869; C08L 23/0876
  See application file for complete search history.

(56) References Cited

U.S. PATENT DOCUMENTS

| | | | | |
|---|---|---|---|---|
| RE38,429 E | * | 2/2004 | Eichbauer | B32B 27/32 428/213 |
| 2003/0099792 A1 | * | 5/2003 | Andersson | B32B 27/32 428/35.2 |
| 2004/0142195 A1 | * | 7/2004 | Roberts | B32B 27/32 428/515 |
| 2005/0031822 A1 | * | 2/2005 | Aihara | B32B 27/32 428/40.1 |
| 2005/0153127 A1 | * | 7/2005 | Aihara | H01L 21/6836 428/343 |
| 2005/0203250 A1 | * | 9/2005 | Miyakawa | H01L 21/6836 525/192 |
| 2007/0093038 A1 | * | 4/2007 | Koenig | H01L 21/6835 438/460 |
| 2007/0254119 A1 | * | 11/2007 | Lloyd-George | B29C 66/8491 428/35.2 |
| 2007/0281152 A1 | | 12/2007 | Yamamoto | |
| 2008/0057216 A1 | * | 3/2008 | Shintani | C09J 7/22 427/487 |
| 2008/0185700 A1 | * | 8/2008 | Takamatsu | B32B 27/32 257/678 |
| 2009/0230595 A1 | * | 9/2009 | Nemoto | B29C 61/003 264/514 |
| 2010/0255299 A1 | * | 10/2010 | Kawashima | B32B 27/08 428/354 |
| 2010/0255302 A1 | * | 10/2010 | Aoyama | C09J 7/381 428/355 EN |
| 2011/0008949 A1 | * | 1/2011 | Sugimura | C09J 7/29 438/464 |
| 2011/0037180 A1 | * | 2/2011 | Yoo | C08G 59/621 257/783 |
| 2011/0135916 A1 | * | 6/2011 | Lu | B32B 27/08 428/336 |
| 2011/0136321 A1 | * | 6/2011 | Kuroda | H01L 21/6835 438/459 |
| 2012/0100320 A1 | * | 4/2012 | Toft | B32B 7/02 428/35.6 |
| 2012/0100356 A1 | * | 4/2012 | Ohlsson | B32B 27/20 428/213 |
| 2012/0270381 A1 | * | 10/2012 | Joo | C09J 163/00 438/460 |
| 2012/0309170 A1 | * | 12/2012 | Hayashishita | H01L 21/6836 438/464 |
| 2013/0034729 A1 | * | 2/2013 | Taya | C09J 7/24 428/354 |
| 2014/0060623 A1 | * | 3/2014 | Naitou | H01L 31/0481 136/251 |
| 2015/0179315 A1 | * | 6/2015 | Chou | C08L 23/0869 428/473.5 |
| 2015/0357225 A1 | | 12/2015 | Taya et al. | |
| 2016/0133500 A1 | * | 5/2016 | Morimoto | B32B 27/06 438/464 |

FOREIGN PATENT DOCUMENTS

| | | | | |
|---|---|---|---|---|
| JP | 2001-072947 A | | 3/2001 | |
| JP | 2003158098 A | * | 5/2003 | |
| JP | 2004-303999 A | | 10/2004 | |
| JP | 2007-324456 A | | 12/2007 | |
| JP | 2009-290001 A | | 12/2009 | |
| JP | 2012089732 A | * | 5/2012 | C09J 7/241 |
| JP | 5414085 B1 | | 2/2014 | |
| JP | 2015109435 A | * | 6/2015 | |
| KR | 101054493 B1 | * | 8/2011 | |
| WO | WO-2013099778 A1 | * | 7/2013 | C08F 220/06 |
| WO | 2014/038353 A1 | | 3/2014 | |

OTHER PUBLICATIONS

Machine translation of JP 2015/109435 A, obtained from J-PlatPat service of the JPO on Nov. 8, 2018.*
Machine translation of JP2003/158098A, obtained from Jpat-plat on Nov. 2, 2018 (Year: 2018).*
Machine translation of JP 2012/089732A, obtained from Jpat-plat on Nov. 2, 2018 (Year: 2018).*
International Search Report of the International Searching Authority dated Sep. 2, 2014 for the corresponding nternational application No. PCT/JP2014/066140 (and English translation).
European Search Report dated Dec. 22, 2017 issued in corresponding EP patent application No. 14895437.3.

\* cited by examiner

BASE FILM FOR DICING SHEETS AND DICING SHEET

CROSS REFERENCE TO RELATED APPLICATION

This application is a U.S. national stage application of PCT/JP2014/066140 filed on Jun. 18, 2014, the content of which is incorporated herein by reference.

TECHNICAL FIELD

The present invention relates to a dicing sheet to which a cut object such as a semiconductor wafer is attached when the cut object is cut and separated into small element pieces, and also relates to a base film used in the dicing sheet.

BACKGROUND ART

Semiconductor wafers such as silicon and gallium arsenide wafers and various types of packages (which may be collectively referred to as a "cut object," hereinafter) are manufactured in a large diameter state and these are cut and separated (diced) into small element pieces (referred to as "chips," hereinafter), which are individually released (picked up) and thereafter transferred to a mounting step as the subsequent step. During this operation, a cut object such as a semiconductor wafer undergoes respective steps of dicing, washing, drying, expanding, picking-up and mounting in a state in which the cut object is attached to a dicing sheet that comprises a base film and a pressure sensitive adhesive layer.

Here, in the base film of the above dicing sheet, a problem of blocking may occur. That is, when the base film is wound up, overlapped parts of the base film are in close contact with each other, and when the base film is wound off, feeding thereof cannot be performed and/or troubles may occur in the feeding. Moreover, when the base film is used as a part of a dicing sheet, the base film may come into close contact with a dicing table to cause transport errors.

In addition, in the above dicing step, cracks (chipping) may occur at cut surfaces of chips due to insufficient fixing of a cut object and the like. Such chipping may deteriorate the bending strength of chips themselves and trap air into an IC package in which the chip or chips are enclosed, and package crack may readily occur. Thin semiconductor wafers are recently made and as the thickness is reduced, the possibility of occurrence of chipping as the above becomes high.

According to the commonly-used full-cut dicing as a specific method for the dicing step, a rotating round blade is used for cutting a cut object. In the full-cut dicing, to ensure that the cut object to which the dicing sheet is attached can be completely cut over the entire surface, the pressure sensitive adhesive layer may also be cut beyond the thickness of the cut object and a part of the base film may further be cut.

During this operation, dicing debris comprising materials that constitute the pressure sensitive adhesive layer and base film may arise from the dicing sheet, and the obtained chips may be contaminated with the dicing debris. One form of such dicing debris is filament-like dicing debris that attaches onto a dicing line or to an area near the cross-section of each chip separated by dicing.

If the chip is enclosed in a package while the filament-like dicing debris as the above remains on the chip, then the filament-like dicing debris attached to the chip will be decomposed by heat used for the enclosing and the thermally decomposed substance may destroy the package and/or cause operational failure in a device obtained. Such filament-like dicing debris is difficult to remove by washing and the yield in the dicing step will thus be considerably reduced due to generation of the filament-like dicing debris. Therefore, when a dicing sheet is used to perform dicing, it is needed to prevent the generation of filament-like dicing debris.

To suppress the generation of such dicing debris, Patent Literature 1 discloses an invention which uses, as the base film of a dicing sheet, a polyolefin-based film irradiated with 1 to 80 Mrad of electron rays or γ (gamma) rays. In this invention, it appears that a resin that constitutes the base film is crosslinked through the irradiation with electron rays or γ rays thereby to suppress the generation of dicing debris.

PRIOR ART LITERATURE

Patent Literature

[Patent Literature 1] JP05-211234A

SUMMARY OF THE INVENTION

Problems to be Solved by the Invention

However, when a resin that constitutes the base film is crosslinked through the irradiation with electron rays or γ rays, mechanical characteristics of the resin deteriorate and the possibility of occurrence of the previously-described chipping becomes high, which may be problematic.

The present invention has been created in view of such actual circumstances as the above and objects of the present invention include providing a base film for dicing sheets and a dicing sheet which are capable of suppressing the occurrence of blocking and excellent in the chipping resistance during the dicing of a cut object and can reduce the dicing debris generated during the dicing.

Means for Solving the Problems

To achieve the above objects, according to a first aspect of the present invention, there is provided a base film for dicing sheets, the base film being used in a dicing sheet comprising the base film and a pressure sensitive adhesive layer laminated on one surface of the base film, wherein the base film comprises at least a first resin layer (A) that is in contact with the pressure sensitive adhesive layer of the dicing sheet and a second resin layer (B) that comes into contact with the first resin layer (A) when the base film for dicing sheets is wound up, the second resin layer (B) has a crystallinity of 28% to 45%, a ratio of a tensile elastic modulus of the first resin layer (A) to a tensile elastic modulus of the second resin layer (B) is 1.2 to 3.0, and a ratio of a thickness of the first resin layer (A) to a thickness of the base film for dicing sheets is 25% to 80% (Invention 1).

According to the above invention (Invention 1), the above physical properties are satisfied thereby to allow suppression of the occurrence of blocking. Moreover, the base film for dicing sheets is excellent in a property of following irregularities such as those of a suction table and can steadily fix a cut object during the dicing, thus exhibiting excellent chipping resistance. Furthermore, the generation of dicing debris during the dicing can be reduced.

In the above invention (Invention 1), a further layer may be laminated between the first resin layer (A) and the second resin layer (B) and in this case it may be preferred that the further layer has a tensile elastic modulus that is not higher than the tensile elastic modulus of the first resin layer (A) (Invention 2).

In the above invention (Invention 1, 2), it may be preferred that at least the first resin layer (A) and the second resin layer (B) contain an olefin-based resin (Invention 3).

In the above invention (Invention 1 to 3), it may be preferred that the second resin layer (B) contains at least one selected from a homopolymer of ethylene and a copolymer of ethylene and (meth)acrylic acid and/or (meth)acrylic ester (Invention 4).

In the above invention (Invention 1 to 4), it may be preferred that the first resin layer (A) comprises, as an example, a resin composition (R1) that contains an ethylene-based copolymer (a1) selected from an ethylene/α,β-unsaturated carboxylic acid copolymer and an ethylene/α,β-unsaturated carboxylic acid/α,β-unsaturated carboxylic ester copolymer, a ternary copolymer (a2) having a constitutional unit originated from α-olefin, a constitutional unit originated from glycidyl (meth)acrylate or glycidyl unsaturated ether and a constitutional unit originated from vinyl ester or unsaturated carboxylic ester, and a polyolefin (a3) (Invention 5).

In the above invention (Invention 5), it may be preferred that the ethylene-based copolymer (a1) is an ethylene/(meth) acrylic acid copolymer (Invention 6).

In the above invention (Invention 5, 6), it may be preferred that the ternary copolymer (a2) is an ethylene/glycidyl (meth)acrylate/alkyl acrylate ester copolymer (Invention 7).

In the above invention (Invention 1 to 4), it may be preferred that the first resin layer (A) comprises, as an example, a resin composition (R2) that contains an ethylene/ (meth)acrylic acid copolymer (a4) and a polypropylene-based resin (a5) (Invention 8).

In the above invention (Invention 1 to 8), it may be preferred that the second resin layer (B) contains, as an example, an ethylene-based copolymer (b1) that is a copolymer of ethylene and (meth)acrylic acid and/or (meth) acrylic ester (Invention 9).

In the above invention (Invention 9), it may be preferred that the ethylene-based copolymer (b1) is an ethylene/(meth) acrylic acid copolymer (Invention 10).

In the above invention (Invention 1 to 8), it may be preferred that the second resin layer (B) comprises, as an example, a resin composition (R4) that contains a polyethylene-based resin (b2) and a thermoplastic elastomer (b3) (Invention 11).

In the above invention (Invention 1 to 11), it may be preferred that the first resin layer (A) has a tensile elastic modulus of 140 to 400 MPa and the second resin layer (B) has a tensile elastic modulus of 100 to 290 MPa (Invention 12).

In the above invention (Invention 1 to 12), it may be preferred that the base film for dicing sheets is formed by coextrusion molding (Invention 13).

According to a second aspect of the present invention, there is provided a dicing sheet comprising a base film and a pressure sensitive adhesive layer laminated on one surface of the base film, wherein the base film is the base film for dicing sheets (Invention 1 to 13) and the pressure sensitive adhesive layer is laminated so as to be in contact with the first resin layer (A) of the base film for dicing sheets (Invention 14).

Advantageous Effect of the Invention

According to the base film for dicing sheets and the dicing sheet of the present invention, the occurrence of blocking can be suppressed, the chipping resistance is excellent because an excellent property of following irregularities is exhibited during the dicing of a cut object, and the dicing debris generated during the dicing can be reduced. Therefore, when the base film for dicing sheets and the dicing sheet according to the present invention are used, process failure is less likely to occur.

EMBODIMENTS FOR CARRYING OUT THE INVENTION

Hereinafter, a base film for dicing sheets (which may be simply referred to as a "base film," hereinafter) and a dicing sheet according to the present invention will be described.

Figure 1:
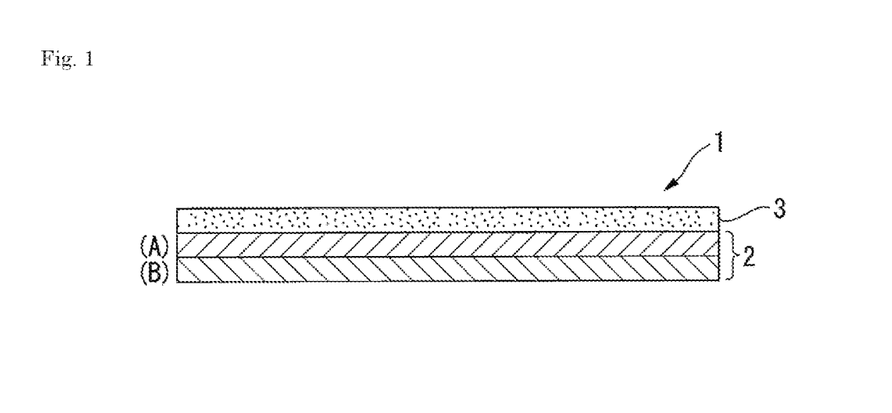
FIG. 1 is a cross-sectional view of a dicing sheet according to an embodiment of the present invention.

As illustrated in FIG. 1, the dicing sheet 1 according to the present embodiment is configured to comprise a base film 2 according to the present embodiment and a pressure sensitive adhesive layer 3 laminated on one surface (upper surface in FIG. 1) of the base film 2.

1. Base Film

The base film 2 according to the present embodiment comprises, as illustrated in FIG. 1, a first resin layer (A) that is in contact with the above pressure sensitive adhesive layer 3 and a second resin layer (B) that is laminated on one surface side (lower surface side in FIG. 1) of the first resin layer (A). When this base film 2 is wound up, the first resin layer (A) and the second resin layer (B) come into contact with each other.

In the above base film 2, the crystallinity of the second resin layer (B) is 28% to 45%, the ratio of a tensile elastic modulus of the first resin layer (A) to a tensile elastic modulus of the second resin layer (B) ((A)/(B)) is 1.2 to 3.0, and the ratio of a thickness of the first resin layer (A) to a thickness of the base film 2 is 25% to 80%. Measurement methods for the crystallinity and tensile elastic modulus are stated in the examples to be described later.

The base film 2 satisfying the above physical properties can suppress the occurrence of blocking. Moreover, the base film 2 is excellent in a property of following irregularities such as those of a suction table and can steadily fix a cut object during the dicing, thus exhibiting excellent chipping resistance. Furthermore, the generation of dicing debris during the dicing can be reduced.

Specifically, when the crystallinity of the second resin layer (B) is 28% to 45% and the ratio of a thickness of the first resin layer (A) to a thickness of the base film 2 is 25% to 80%, the base film 2 as a whole can exhibit an excellent property of following irregularities and can effectively suppress the chipping from occurring when dicing a cut object. If the crystallinity of the second resin layer (B) is less than 28%, tack will be caused in the second resin layer (B) and the blocking may readily occur because the second resin layer (B) and the first resin layer (A) come into close contact with each other when the base film 2 is wound up. Therefore, when the wound-up base film is wound off, feeding thereof cannot be performed and/or troubles may occur in the feeding. In addition, when the base film 2 is used as a part of the dicing sheet 1, the base film 2 may come into close contact with a dicing table to readily cause transport errors. If the crystallinity of the second resin layer (B) exceeds 45%, the stiffness will increase to significantly reduce the property of following irregularities and the chipping may readily occur during the dicing.

In view of the above, the crystallinity of the second resin layer (B) may preferably be 29% to 40% and particularly preferably 30 to 35%.

When the ratio of a tensile elastic modulus of the first resin layer (A) to a tensile elastic modulus of the second resin layer (B) is 1.2 to 3.0, the first resin layer (A) can be relatively rigid. Together with this physical property, when the ratio of a thickness of the first resin layer (A) to a thickness of the base film 2 is 25% to 80%, it is possible to suppress the occurrence of blocking and reduce the dicing debris generated during the dicing of a cut object without diminishing the excellent property of following irregularities by the second resin layer (B). If the above ratio of tensile elastic moduli is less than 1.2, blocking will readily occur and the chipping will also readily occur because a cut object cannot be steadily fixed during the dicing. If the above ratio of tensile elastic moduli exceeds 3.0, abnormal cutting may occur at the outer circumferential part of a suction table when the dicing is performed at high speed, and as a result the possibility will become high that the dicing sheet 1 is broken immediately after the dicing.

In view of the above, the ratio of a tensile elastic modulus of the first resin layer (A) to a tensile elastic modulus of the second resin layer (B) may preferably be 1.2 to 2.5 and particularly preferably 1.2 to 2.0.

When the ratio of a thickness of the first resin layer (A) to a thickness of the base film 2 is 25% to 80%, the above action and effect are exhibited. If the above ratio of thicknesses is less than 25%, dicing debris may be readily generated during the dicing. If the above ratio of thicknesses exceeds 80%, the chipping resistance will deteriorate and troubles may occur, including that the base film 2 breaks off when being expanded.

In view of the above, the ratio of a thickness of the first resin layer (A) to a thickness of the base film 2 may preferably be 35% to 70% and particularly preferably 40% to 60%.

The tensile elastic modulus of the first resin layer (A) may preferably be 140 to 400 MPa, particularly preferably 150 to 350 MPa, and further preferably 160 to 300 MPa. The tensile elastic modulus of the second resin layer (B) may preferably be 100 to 290 MPa, particularly preferably 125 to 240 MPa, and further preferably 130 to 230 MPa. When the tensile elastic moduli of the first resin layer (A) and second resin layer (B) fall within the above ranges, the ratio of a tensile elastic modulus of the first resin layer (A) to a tensile elastic modulus of the second resin layer (B) may readily fall within the above range and it is possible to more enhance the chipping resistance, effect of suppressing the occurrence of blocking, and effect of reducing the dicing debris. In particular, when the tensile elastic modulus of the first resin layer (A) falls within the above range, the cut object can be steadily supported during the dicing even for thin cut objects (such as a semiconductor wafer).

The tensile elastic modulus of the base film 2 as a whole may preferably be 100 to 300 MPa, particularly preferably 110 to 280 MPa, and further preferably 120 to 250 MPa. If the tensile elastic modulus of the base film 2 is less than 100 MPa, the base film 2 will get loose because of its flexibility when the dicing sheet 1 is attached to a wafer and fixed to a ring frame, which may possibly cause transport errors. If the tensile elastic modulus exceeds 300 MPa, the load to be applied during the expanding step may have to be increased and problems may occur, including that the dicing sheet 1 itself is detached from the ring frame.

Each of the first resin layer (A) and the second resin layer (B) may preferably contain an olefin-based resin. Examples of the olefin-based resin include: polyolefin such as polyethylene, polypropylene, polybutene, ethylene/propylene copolymer and ethylene/butene copolymer; and copolymer obtained by polymerizing an olefin compound and one or more selected from acrylic compounds. Among them, a polymer of which the constitutional monomer is ethylene may be preferred.

When the first resin layer (A) and the second resin layer (B) each contain the above material, the previously-described physical properties may be readily satisfied and the interfacial adhesion between the first resin layer (A) and the second resin layer (B) can be improved. These resin layers will be described below in detail.

(1) First Resin Layer (A)

The first resin layer (A) may preferably comprise a resin composition (R1) that contains an ethylene-based copolymer (a1) selected from an ethylene/α,β-unsaturated carboxylic acid copolymer and an ethylene/α,β-unsaturated carboxylic acid/α,β-unsaturated carboxylic ester copolymer, a ternary copolymer (a2) having a constitutional unit originated from α-olefin, a constitutional unit originated from glycidyl (meth)acrylate or glycidyl unsaturated ether and a constitutional unit originated from vinyl ester or unsaturated carboxylic ester, and a polyolefin (a3) or may also preferably comprise a resin composition (R2) that contains an ethylene/(meth)acrylic acid copolymer (a4) and a polypropylene-based resin (a5). The first resin layer (A) comprising such a material may particularly readily satisfy the previously-described physical properties and it is possible to more enhance the effect of suppressing the occurrence of blocking, effect of reducing the dicing debris, and chipping resistance. As used in the present description, the "(meth)acrylate" is a collective term of acrylate and methacrylate. The same applies to similar terms.

(1-1) Resin Composition (R1)

The resin composition (R1) contains an ethylene-based copolymer (a1), a ternary copolymer (a2), and a polyolefin (a3).

(1-1-1) Ethylene-Based Copolymer (a1)

The ethylene-based copolymer (a1) is at least one selected from an ethylene/α,β-unsaturated carboxylic acid copolymer and an ethylene/α,β-unsaturated carboxylic acid/α,β-unsaturated carboxylic ester copolymer.

The ethylene/α,β-unsaturated carboxylic acid copolymer is a polymer that is obtained by copolymerizing ethylene and a monomer selected from α,β-unsaturated carboxylic acids, at least as the copolymerization components. The ethylene/α,β-unsaturated carboxylic acid/α,β-unsaturated carboxylic ester copolymer is a polymer that is obtained by copolymerizing ethylene, a monomer selected from α,β-unsaturated carboxylic acids, and a monomer selected from α,β-unsaturated carboxylic esters, at least as the copolymerization components. In the ethylene/α,β-unsaturated carboxylic acid copolymer, other monomers than ethylene and unsaturated carboxylic acid may be copolymerized, if necessary. In the ethylene/α,β-unsaturated carboxylic acid/α,β-unsaturated carboxylic ester copolymer, other monomers than ethylene, unsaturated carboxylic acid and unsaturated carboxylic ester may be copolymerized, if necessary.

The copolymer may be any of block copolymer, random copolymer, or graft copolymer. Among them, a binary random copolymer or ternary random copolymer may be preferred in view of the reactivity with glycidyl (meth) acrylate or glycidyl unsaturated ether and the industrial availability.

Examples of the α,β-unsaturated carboxylic acid, which constitutes the ethylene/α,β-unsaturated carboxylic acid copolymer or the ethylene/α,β-unsaturated carboxylic acid/α,β-unsaturated carboxylic ester copolymer, include unsaturated carboxylic acids of which the carbon number is 4 to 8, such as acrylic acid, methacrylic acid, ethacrylic acid, itaconic acid, itaconic acid anhydride, fumaric acid, crotonic acid, maleic acid, maleic acid anhydride, maleic monoester (such as monomethyl maleate and monoethyl maleate), and maleic monoester anhydride (such as monomethyl maleate anhydride and monoethylmaleate anhydride). Salts of unsaturated carboxylic acid are also included.

Among the above, acrylic acid, methacrylic acid, maleic acid, maleic acid anhydride, maleic monoester and maleic monoester anhydride may be preferred and acrylic acid and methacrylic acid may be particularly preferred.

Examples of the α,β-unsaturated carboxylic ester, which constitutes the ethylene/α,β-unsaturated carboxylic acid/α,β-unsaturated carboxylic ester copolymer, include alkyl esters, of which the carbon number is 1 to 8, of unsaturated carboxylic acids, such as acrylic alkyl ester, methacrylic alkyl ester, ethacrylic alkyl ester, crotonic alkyl ester, fumaric alkyl ester, maleic alkyl ester, maleic monoalkyl ester, maleic alkyl ester anhydride, itaconic alkyl ester, and itaconic alkyl ester anhydride. When containing such constitutional units originated and delivered from α,β-unsaturated carboxylic esters, the obtained copolymer can have improved flexibility, which may be preferred.

Examples of the alkylated site of the above alkyl ester include those of which the carbon number is 1 to 12, more specifically alkyl groups such as methyl, ethyl, n-propyl, isopropyl, n-butyl, isobutyl, secondary butyl, 2-ethylhexyl, and isooctyl. Among them, alkyl esters having alkylated sites of which the carbon number is 1 to 8 may be preferred.

In particular, methyl ester, ethyl ester, normal butyl ester and isobutyl ester of acrylic acid or methacrylic acid may be preferred as the above α,β-unsaturated carboxylic ester.

Specific examples of the ethylene/α,β-unsaturated carboxylic acid copolymer include ethylene/acrylic acid copolymer and ethylene/methacrylic acid copolymer. Commercially available products put on the market as the ethylene/α,β-unsaturated carboxylic acid copolymer may also be used. Examples of such commercially available products to be used include Nucrel series (product name) available from DUPONT-MITSUI POLYCHEMICALS CO., LTD.

Content ratio (mass ratio) of the constitutional units originated from α,β-unsaturated carboxylic acid in the ethylene/α,β-unsaturated carboxylic acid copolymer may preferably be 1 to 20 mass % and more preferably 5 to 20%. This can improve the blocking resistance of the obtained copolymer.

Specific examples of the ethylene/α,β-unsaturated carboxylic acid/α,β-unsaturated carboxylic ester copolymer include ethylene/(meth)acrylic acid/(meth)acrylic ester copolymers as preferred examples, among which ethylene/(meth)acrylic acid/methyl acrylate copolymer, ethylene/(meth)acrylic acid/ethyl acrylate copolymer, ethylene/(meth)acrylic acid/normal-butyl acrylate copolymer, ethylene/(meth)acrylic acid/isobutyl acrylate copolymer, ethylene/(meth)acrylic acid/methyl methacrylate copolymer, ethylene/(meth)acrylic acid/ethyl methacrylate copolymer, ethylene/(meth)acrylic acid/normal-butyl methacrylate copolymer, and ethylene/(meth)acrylic acid/isobutyl methacrylate copolymer may be preferred. Among them, copolymers of ethylene/(meth)acrylic acid/alkyl (meth)acrylate of which the carbon number is 1 to 8 (preferably 1 to 4) may be particularly preferred.

Content ratio (mass ratio) of the constitutional units originated from α,β-unsaturated carboxylic acid in the ethylene/α,β-unsaturated carboxylic acid/α,β-unsaturated carboxylic ester copolymer may preferably be 1 to 20 mass % and more preferably 5 to 20%. This can improve the blocking resistance of the obtained copolymer.

In consideration of a more significant effect of improving the blocking resistance, it may be more preferred that the ethylene-based copolymer contains the ethylene/α,β-unsaturated carboxylic acid copolymer rather than the ethylene/α,β-unsaturated carboxylic acid/α,β-unsaturated carboxylic ester copolymer, among the above.

Content ratio (mass ratio) of the constitutional units originated from α,β-unsaturated carboxylic ester in the ethylene/α,β-unsaturated carboxylic acid/α,β-unsaturated carboxylic ester copolymer may preferably be 1 to 20 mass % and more preferably 3 to 18% to the total mass of the copolymer. This can suppress the blocking more effectively.

Melt mass flow rate (MFR) of the ethylene-based copolymer (a1) may preferably be 2 to 500 g/10 min, particularly preferably 2 to 150 g/10 min, and further preferably 2 to 120 g/10 min. The melt mass flow rate being within the above range is advantageous in the film moldability. The MFR of the ethylene-based copolymer (a1) and those of a ternary copolymer (a2) and a mixed resin obtained by melting and mixing three components (a1) to (a3) to be described later may be values that are measured at 190° C. and 2.16 kgf using a method in accordance with JIS K7210-1999.

Content of the ethylene-based copolymer (a1) in the resin composition (R1) may preferably be 50 to 99 mass %, more preferably 50 to 94.5 mass %, particularly preferably 50 to 85 mass %, and further preferably 60 to 85 mass %, to the total amount of the resin composition (R1).

(1-1-2) Ternary Copolymer (a2)

The ternary copolymer (a2) has a constitutional unit originated from α-olefin, a constitutional unit originated from glycidyl (meth)acrylate or glycidyl unsaturated ether, and a constitutional unit originated from vinyl ester or unsaturated carboxylic ester. That is, the ternary copolymer (a2) is a copolymer that is obtained at least by copolymerizing α-olefin (preferably ethylene), glycidyl (meth)acrylate or glycidyl unsaturated ether, and vinyl ester or unsaturated carboxylic ester. If necessary, other monomers may be further copolymerized.

Examples of the α-olefin include α-olefins of which the carbon number is 2 to 10 (such as ethylene, propylene, 1-butene, 1-pentene, 1-hexene, 4-methyl-1-pentene, 3-methyl-1-butene and 1-octene, for example), among which ethylene and propylene may be preferred.

Examples of the glycidyl (meth)acrylate or glycidyl unsaturated ether include glycidyl acrylate, glycidyl methacrylate, vinylglycidylether, allylglycidylether, and 2-methylallylglycidylether.

Examples of the vinyl ester include vinyl acetate and vinyl propionate.

Examples of the unsaturated carboxylic ester include esters of the α,β-unsaturated carboxylic acid in the above ethylene-based copolymer (a1). Preferred ones may be lower alkyl esters, of which the carbon number is 2 to 5, of the above α,β-unsaturated carboxylic acid and further preferred ones may be alkyl esters of which the carbon number is 4, such as isobutyl and n-butyl esters, of the above α,β-unsaturated carboxylic acid.

Examples of the unsaturated carboxylic ester include ester compounds such as methyl acrylate, ethyl acrylate, isopropyl acrylate, isobutyl acrylate, n-butyl acrylate, isooctyl acrylate, methyl methacrylate, isobutyl methacrylate, and dimethyl maleate. Among them, lower alkyl esters (carbon number of 2 to 5) of acrylic acid or methacrylic acid may be preferred, such as methyl acrylate, ethyl acrylate, isopropyl acrylate, isobutyl acrylate, n-butyl acrylate, methyl methacrylate, and isobutyl methacrylate. Further, n-butyl esters and isobutyl esters of acrylic acid or methacrylic acid may be preferred, among which alkyl esters having a carbon number of 4 of acrylic acid may be preferred and isobutyl esters may be particularly preferred.

The ratio (mass ratio) of constitutional units originated from the α-olefin in the ternary copolymer (a2) may preferably be 40 to 99 mass % and more preferably 50 to 98 mass % to the total mass of the ternary copolymer (a2).

The ratio (mass ratio) of constitutional units originated from the glycidyl (meth)acrylate or glycidyl unsaturated ether in the ternary copolymer (a2) may preferably be 0.5 to 20 mass % and more preferably 1 to 15 mass % to the total mass of the ternary copolymer (a2). When the ratio of constitutional units originated from the glycidyl (meth) acrylate or glycidyl unsaturated ether is 0.5 mass % or more, the effect of improving the blocking resistance is large. When the ratio of constitutional units originated from the glycidyl (meth)acrylate or glycidyl unsaturated ether is 20 mass % or less, the reaction with the unsaturated carboxylic acid is not excessively strong. Therefore, the rapid increase in the resin viscosity can be suppressed to maintain the moldability and prevent the generation of gels in the composition.

The ratio (mass ratio) of constitutional units originated from the vinyl ester or unsaturated carboxylic ester in the ternary copolymer (a2) may preferably be 1 to 40 mass % to the total mass of the ternary copolymer. When the ratio of constitutional units originated from the vinyl ester or unsaturated carboxylic ester is 40 mass % or less, appropriate flexibility can be obtained and excellent blocking resistance can also be obtained because the tack is suppressed. The ratio being 1 mass % or more means that the constitutional units originated from the vinyl ester or unsaturated carboxylic ester are contained in a positive manner.

The ternary copolymer (a2) may be any of a random copolymer or graft copolymer. In general, a random copolymer may be preferred because of the homogeneity in the reaction with the ethylene/α,β-unsaturated carboxylic acid copolymer. Such a random copolymer may be obtained, for example, by radical copolymerization under a high temperature and high pressure.

Melt mass flow rate (MFR) of the ternary copolymer (a2) may preferably be 0.01 to 1,000 g/10 min and particularly preferably 0.1 to 200 g/10 min. The melt mass flow rate being within the above range is advantageous in the blocking resistance because the degree of crosslinking is enhanced.

The content of the ternary copolymer (a2) in the resin composition (R1) may preferably be 0.1 to 10 mass %, more preferably 0.5 to 10 mass %, particularly preferably 1 to 10 mass %, and further preferably 1 to 8 mass %, to the total amount of the resin composition (R1).

(1-1-3) Polyolefin (a3)

When the resin composition (R1) contains the polyolefin (a3), dispersibility of other components is improved and the resin composition (R1) can be obtained with excellent blocking resistance.

Examples of the polyolefin (a3) include homopolymers and copolymers of α-olefin of which the carbon number is 2 to 10 (such as ethylene, propylene, 1-butene, 1-pentene, 1-hexene, 4-methyl-1-pentene, 3-methyl-1-butene and 1-octene, for example), and those manufactured by various methods using various catalysts can be used. More specific examples of polyolefin include polyethylene, polypropylene, polybutene-1, and poly-4-methyl-1-pentene.

Low-density polyethylene (LDPE) and linear low-density polyethylene (LLDPE) may be preferred as the above polyethylene. Among the linear low-density polyethylenes, linear low-density polyethylene manufactured using a homogeneous catalyst such as metallocene catalyst may be particularly preferred.

Examples of the above polypropylene include polymers selected from propylene homopolymers and propylene-based copolymers obtained by copolymerization of propylene and other monomers.

Examples of the above propylene-based copolymers include, for example, random copolymers, block copolymers and alternate copolymers of propylene and ethylene and/or α-olefin other than ethylene (the carbon number is preferably 4 to 8). Among them, homopolymers and random copolymers may be preferred.

In view of the blocking resistance, among the above, random polypropylene, homopolypropylene, low-density polyethylene and linear low-density polyethylene may be preferred as the polyolefin.

Melt mass flow rate (MFR) of the polyolefin (a3) may preferably be 0.5 to 100 g/10 min, more preferably 1 to 50 g/10 min, and particularly preferably 1 to 20 g/10 min. The MFR of the polyolefin (a3) may be a value that is measured at 230° C. and 2.16 kgf using a method in accordance with JIS K7210-1999.

The content of the polyolefin (a3) in the resin composition (R1) may preferably be 0.5 to 40 mass %, more preferably 5 to 40 mass %, and particularly preferably 10 to 35 mass %, to the total amount of the resin composition (R1).

In the resin composition (R1), it may be particularly preferred that the content ratio of the ethylene-based copolymer (a1) is 50 to 94.5 mass %, the content ratio of the ternary copolymer (a2) is 0.5 to 10 mass %, and the content ratio of the polyolefin (a3) is 5 to 40 mass %. The content ratio of the ternary copolymer (a2) being 0.5 mass % or more is advantageous in obtaining more excellent blocking resistance. The content ratio of the ternary copolymer (a2) being 10 mass % or less is advantageous in that the reaction with the ethylene-based copolymer is not excessively strong and moderate viscosity can thus be maintained to suppress the generation of gels in the composition. The content ratio of the polyolefin (a3) being 5 mass % or more is advantageous in the blocking resistance. The content ratio of the polyolefin (a3) being 40 mass % or less is advantageous in the dispersibility with other components. In the resin composition (R1), it may be further preferred that the content ratio of the ethylene-based copolymer (a1) is 55 to 89 mass %, the content ratio of the ternary copolymer (a2) is 1 to 10 mass %, and the content ratio of the polyolefin (a3) is 10 to 35 mass %.

The resin composition (R1) can be obtained by melting and mixing the ethylene-based copolymer (a1), ternary copolymer (a2), and polyolefin (a3). When melting and mixing them, an ordinarily-used mixing apparatus, such as a screw extruder, roll mixer and Banbury mixer, can be used. The melting and mixing may be performed by compounding the three components (a1) to (a3) at once.

Among the above, a preferred method may include preliminarily melting and mixing the ternary copolymer (a2) and polyolefin (a3) and further melting and mixing the molten mixture obtained by the melting and mixing and the ethylene-based copolymer (a1). According to this method, the ternary copolymer (a2) is diluted with the polyolefin (a3) thereby to allow the reaction with the ethylene-based copolymer (a1) to progress homogeneously without occurring locally, and therefore a composition having excellent properties can advantageously be manufactured with good quality stability. On the other hand, according to a method that includes melting and mixing the ethylene-based copolymer (a1) and ternary copolymer (a2) first and then mixing the polyolefin (a3), unfortunately, the reaction may progress locally to generate gels. When melting and mixing the above three components (a1) to (a3) at once, it may be preferred to use a biaxial extruder to perform the melting and mixing.

Melt mass flow rate (MFR) of the mixed resin obtained by melting and mixing the above three components (a1) to (a3) may preferably be 0.2 to 3.1 g/10 min, more preferably 0.2 to 2.5 g/10 min, and particularly preferably 0.2 to 2.0 g/10 min, in view of the fusion bonding resistance when the components are formed into a molded body.

The resin composition (R1) may contain various additives, such as pigment, flame retardant, plasticizer, antistatic, glidant and filler, in addition to the above three components (a1) to (a3). Examples of the pigment include titanium dioxide and carbon black. Examples of the filler include organic materials such as melamine resin, inorganic materials such as fumed silica, and metal-based materials such as nickel particles. The content of such additives is not particularly limited, but should be within a range in which the first resin layer (A) can exhibit desired functionality and does not lose the smoothness and flexibility.

(1-2) Resin Composition (R2)

The resin composition (R2) contains an ethylene/(meth)acrylic acid copolymer (a4) and a polypropylene-based resin (a5). The resin composition (R2) contains the ethylene/(meth)acrylic acid copolymer (a4) thereby to allow the base film 2 as a whole to exhibit excellent expandability. The resin composition (R2) contains the polypropylene-based resin (a5) thereby to have an effect of preventing the blocking when the film is wound up. Moreover, it is possible to adjust the elastic modulus of the base film as a whole and a subsidiary effect can be obtained for suppressing the dicing debris.

(1-2-1) Ethylene/(Meth)Acrylic Acid Copolymer (a4)

The ethylene/(meth)acrylic acid copolymer (a4) is a copolymer of ethylene and (meth)acrylic acid. Methacrylic acid may be particularly preferred as the (meth)acrylic acid. The copolymer may be any of a block copolymer, random copolymer, or graft copolymer.

The content ratio of constitutional units originated from (meth)acrylic acid in the ethylene/(meth)acrylic acid copolymer (a4) may preferably be 2 to 14 mass %, more preferably 4 to 12 mass %, and particularly preferably 5 to 10 mass %, as a mass ratio of (meth)acrylic acid to the whole monomers for forming the copolymer. If the above mass ratio of (meth)acrylic acid exceeds 14 mass %, the crystallinity of the ethylene/(meth)acrylic acid copolymer (a4) will deteriorate to cause sticking at ordinary temperatures, which may negatively affect the blocking when the film is wound up. If the above mass ratio of (meth)acrylic acid is less than 2 mass %, the crystallinity of the first resin layer (A) will increase and the base film 2 as a whole may thus be difficult to exhibit excellent expandability.

The ethylene/(meth)acrylic acid copolymer (a4) may contain constitutional units originated from other compounds in addition to those originated from ethylene, acrylic acid and/or methacrylic acid to an extent that does not impair the objects of the dicing sheet 1 according to the present embodiment. Examples of such other compounds include: α-olefin such as propylene; and (meth)acrylic ester such as methyl (meth)acrylate and ethyl (meth)acrylate. The content ratio of such constitutional units originated from other compounds may preferably be a ratio of less than 10 mass % as a mass ratio of these other compounds to the whole monomers for forming the copolymer.

The tensile elastic modulus of the ethylene/(meth)acrylic acid copolymer (a4) may preferably be 80 to 250 MPa, more preferably 120 to 230 MPa, and particularly preferably 150 to 200 MPa, in view of obtaining excellent chipping resistance.

The content of the ethylene/(meth)acrylic acid copolymer (a4) in the resin composition (R2) may preferably be 60 to 95 mass %, particularly preferably 70 to 93 mass %, and further preferably 75 to 90 mass %. If the content of the ethylene/(meth)acrylic acid copolymer (a4) exceeds 15 mass %, the pressure sensitive adhesion property of the ethylene/(meth)acrylic acid copolymer (a4) alone will be excessively high and troubles (such as deterioration in the workability) may possibly occur when the resin composition (R2) is molded into a film-like shape to form the first resin layer (A). If the content of the ethylene/(meth)acrylic acid copolymer (a4) is less than 2 mass %, the expandability may possibly deteriorate.

(1-2-2) Polypropylene-Based Resin (a5)

Propylene-based polymer of the polypropylene-based resin (a5) may be a homopolymer of propylene or may also be a copolymer of propylene and other compounds having ethylenically unsaturated bonds. In the present description, compounds that are contained in the propylene-based polymer of the polypropylene-based resin (a5) and have ethylenically unsaturated bonds to give constitutional units other than the constitutional units originated from propylene are also referred to as "other unsaturated compounds." In view of stably obtaining properties as those of polypropylene, preferred examples of the other unsaturated compounds include α-olefin and ethylene. As the α-olefin, there may be exemplified an alkene which has a double bond at the α-site and of which the carbon number is 4 to 18, such as 1-butene, 1-hexene, and 1-octene.

When the propylene-based polymer of the polypropylene-based resin (a5) is a copolymer of propylene and other unsaturated compounds, the content ratio of constitutional units originated from propylene in the copolymer may ordinarily be 75 to 99.9 mass %, preferably 80 to 99 mass %, more preferably 85 to 99 mass %, and further preferably 90 to 99 mass %, as a mass ratio of propylene to the whole monomers for forming the copolymer. When the propylene-based polymer of the polypropylene-based resin (a5) contains a copolymer in which the above mass ratio of propylene is 75 mass % or more, the generation of dicing debris at the time of processing the dicing sheet 1 can be more stably suppressed.

When the propylene-based polymer of the polypropylene-based resin (a5) contains a copolymer, the specific form of the copolymer is not particularly limited and it may be any of a random copolymer, block copolymer, and graft copolymer. The propylene-based polymer may contain two or more types of such copolymers. Among these forms, a random copolymer may be preferred because the possibility of generation of dicing debris during the dicing step can be more stably reduced.

The polypropylene-based resin (a5) may preferably be a thermoplastic resin in view of easily manufacturing the first resin layer (A), etc. In this case, the propylene-based polymer of the polypropylene-based resin (a5) may be in a state in which it is not crosslinked or the degree of crosslinking is appropriately controlled. When the polypropylene-based resin (a5) is a thermoplastic resin, the melt mass flow rate (MFR) when measured at a temperature of 230° C. and a load of 2.16 kgf (in accordance with JIS K7210-1999) may preferably be 0.5 to 10 g/10 min and more preferably 2.0 to 7.0 g/10 min.

When the polypropylene-based resin (a5) is a thermoplastic resin and crystalline, the melting peak temperature may preferably be 125° C. to 170° C. and more preferably 130° C. to 165° C. If the melting peak temperature of the polypropylene-based resin (a5) is lower than 125° C., the generation of dicing debris may not be readily suppressed because the content of propylene monomers that constitute the polypropylene-based resin (a5) may be small. If the melting peak temperature of the polypropylene-based resin (a5) exceeds 170° C., the molecular weight of the propylene-based polymer of the polypropylene-based resin (a5) may be excessively large and concerns are that it will be difficult to make the first resin layer (A) thin when molding the resin composition for forming the first resin layer (A) (resin composition (R2)) into a film-like shape and variation may occur in its thickness.

When the polypropylene-based resin (a5) is a thermoplastic resin and crystalline, the melting heat quantity may preferably be 70 to 110 J/g. If the melting heat quantity of the polypropylene-based resin (a5) is less than 70 J/g, the generation of dicing debris during the dicing step may not be readily suppressed because the crystallinity of the propylene-based polymer of the polypropylene-based resin (a5) may be small. In addition, the pressure sensitive adhesion property of the polypropylene-based resin (a5) alone will be excessively high and troubles (such as deterioration in the workability) may possibly occur when the resin composition for forming the first resin layer (A) is molded into a film-like shape. If the melting heat quantity of the polypropylene-based resin (a5) exceeds 110 J/g, the crystallinity of the propylene-based polymer of the polypropylene-based resin (a5) will be high and the expandability may possibly deteriorate.

The melting peak temperature and melting heat quantity ΔH in the present description refer to values that are obtained using a differential scanning calorimeter (model number: Q2000 available from TA Instruments was used in the exemplary test). Specifically, they may be measured in a manner as below. That is, after heating is performed at a heating rate of 20° C./min from −50° C. to 250° C., rapid cooling is performed to −50° C. from which heating is performed again at a heating rate of 20° C./min to 250° C., and the temperature is maintained. The peak temperature obtained in the second heating measurement is employed as the melting peak temperature. The melting heat quantity ΔH is calculated from data obtained when cooling is performed thereafter at a heating rate of 20° C./min from 250° C. to −50° C.

The tensile elastic modulus of the polypropylene-based resin (a5) may preferably be 600 to 999 MPa, more preferably 650 to 990 MPa, and particularly preferably 700 to 990 MPa, in view of suppressing the generation of dicing debris during the dicing step.

The content of the polypropylene-based resin (a5) in the resin composition (R2) may preferably be 5 to 40 mass %, particularly preferably 7 to 30 mass %, and further preferably 10 to 25 mass %. If the content of the polypropylene-based resin (a5) exceeds 40 mass %, the expandability may possibly deteriorate. If the content of the polypropylene-based resin (a5) is less than 5 mass %, the generation of dicing debris may not be readily suppressed.

The resin composition (R2) can be obtained by melting and mixing the ethylene/(meth)acrylic acid copolymer (a4) and the polypropylene-based resin (a5). The method of melting and mixing is the same as the previously-described method.

The resin composition (R2) may contain other polymers and/or various additives as in the resin composition (R1) in addition to the above two components (a4) and (a5).

(1-3) Thickness of First Resin Layer (A)

The thickness of the first resin layer (A) may preferably be 10 to 120 μm, particularly preferably 20 to 100 μm, and further preferably 30 to 80 μm. When the thickness of the first resin layer (A) is 10 μm or more, the generation of dicing debris can be effectively suppressed during the dicing. When the thickness of the first resin layer (A) is 120 μm or less, the chipping resistance of the base film 2 may be readily maintained at high level.

In the present embodiment, the first resin layer (A) is composed of one resin layer, but the first resin layer (A) may also have a structure comprising a plurality of resin layers. In this case, each layer that constitutes the first resin layer (A) may have the previously-described physical properties and compositional features of the first resin layer (A).

(2) Second Resin Layer (B)

As previously described, the second resin layer (B) may preferably contain a polymer of which the constitutional monomer is ethylene. The polymer of which the constitutional monomer is ethylene may preferably be one selected from a homopolymer of ethylene (polyethylene) and a copolymer of ethylene and (meth)acrylic acid and/or (meth)acrylic ester. In particular, the second resin layer (B) may preferably comprise a resin composition (R3) that contains a copolymer of ethylene and (meth)acrylic acid and/or (meth)acrylic ester (which may be referred to as an "ethylene-based copolymer (b1)") or a resin composition (R4) that contains a polyethylene-based resin (b2) and a thermoplastic elastomer (b3).

(2-1) Resin Composition (R3)

The resin composition (R3) contains an ethylene-based copolymer (b1) that is a copolymer of ethylene and (meth)acrylic acid and/or (meth)acrylic ester. Specifically, the resin composition (R3) may contain, as the ethylene-based copolymer (b1), an ethylene/(meth)acrylic acid copolymer and/or an ethylene/(meth)acrylic ester copolymer, preferably an ethylene/(meth)acrylic acid copolymer, and particularly preferably an ethylene/methacrylic acid copolymer. According to the ethylene-based copolymer (b1), the second resin layer (B) having an excellent property of following irregularities and excellent toughness can be readily obtained and the interfacial adhesion of the second resin layer (B) to the first resin layer (A) can also be enhanced.

The content ratio of constitutional units originated from (meth)acrylic acid in the above ethylene/(meth)acrylic acid copolymer may preferably be 2 to 20 mass %, more preferably 4 to 15 mass %, and particularly preferably 5 to 12 mass %, as a mass ratio of (meth)acrylic acid to the whole monomers for forming the copolymer. If the above mass ratio of (meth)acrylic acid is less than 2 mass %, the crystallinity of the second resin layer (B) will increase to deteriorate the property of following irregularities and the chipping may readily occur during the dicing. If the above mass ratio of (meth)acrylic acid exceeds 20 mass %, tack may occur in the second resin layer (B) itself and concern is that the dicing sheet 1 cannot be transported when performing the dicing using an apparatus.

The ethylene/(meth)acrylic acid copolymer may contain constitutional units originated from other compounds in addition to those originated from ethylene, acrylic acid and/or methacrylic acid to an extent that does not impair the objects of the dicing sheet 1 according to the present embodiment. Examples of such other compounds include: α-olefin such as propylene; and (meth)acrylic ester such as methyl (meth)acrylate and ethyl (meth)acrylate. The content ratio of such constitutional units originated from other compounds may preferably be a ratio of less than 10 mass % as a mass ratio of these other compounds to the whole monomers for forming the copolymer.

(Meth)acrylic alkyl ester may be preferred as the (meth)acrylic ester in the above ethylene/(meth)acrylic ester copolymer, and (meth)acrylic alkyl ester of which the carbon number of alkyl group is 1 to 20 may be particularly preferred. Examples of the (meth)acrylic alkyl ester of which the carbon number of alkyl group is 1 to 20 include, for example, methyl (meth)acrylate, ethyl (meth)acrylate, propyl (meth)acrylate, n-butyl (meth)acrylate, n-pentyl (meth)acrylate, n-hexyl (meth)acrylate, 2-ethylhexyl (meth)acrylate, isooctyl (meth)acrylate, n-decyl (meth)acrylate, n-dodecyl (meth)acrylate, myristyl (meth)acrylate, palmityl (meth)acrylate, and stearyl (meth)acrylate. Among them, (meth)acrylic ester of which the carbon number of alkyl group is 1 to 8 may be preferred, and (meth)acrylic ester of which the carbon number of alkyl group is 1 to 6 may be particularly preferred, in view of the property of following irregularities. They may be used alone or two or more types may be used in combination.

The content ratio of constitutional units originated from (meth)acrylic ester in the ethylene/(meth)acrylic ester copolymer may preferably be 2 to 20 mass %, more preferably 4 to 15 mass %, and particularly preferably 5 to 12 mass %, as a mass ratio of (meth)acrylic ester to the whole monomers for forming the copolymer. If the above mass ratio of (meth)acrylic ester is less than 2 mass %, the property of following irregularities as required during the dicing may possibly be impaired. If the above mass ratio of (meth)acrylic ester exceeds 20 mass %, sticking of resin itself will be strong and blocking may possibly occur, such as when winding up the film.

The ethylene/(meth)acrylic ester copolymer may contain constitutional units originated from other compounds in addition to those originated from ethylene, acrylic acid and/or methacrylic acid to an extent that does not impair the objects of the dicing sheet 1 according to the present embodiment. Examples of such other compounds include α-olefin, such as propylene, and (meth)acrylic acid. The content ratio of such constitutional units originated from other compounds may preferably be a ratio of less than 10 mass % as a mass ratio of these other compounds to the whole monomers for forming the copolymer.

The content of the ethylene-based copolymer (b1) in the resin composition (R3) may preferably be 70 mass % or more, more preferably 80 mass % or more, and further preferably 90 mass % or more.

The resin composition (R3) may contain various additives, such as pigment, flame retardant, plasticizer, antistatic, glidant and filler, in addition to the above ethylene-based copolymer (b1). Examples of the pigment include titanium dioxide and carbon black. Examples of the filler include organic materials such as melamine resin, inorganic materials such as fumed silica, and metal-based materials such as nickel particles. The content of such additives is not particularly limited, but should be within a range in which the second resin layer (B) can exhibit desired functionality and does not lose the smoothness and flexibility.

(2-2) Resin Composition (R4)

The resin composition (R4) contains a polyethylene-based resin (b2) and a thermoplastic elastomer (b3). The resin composition (R4) contains the polyethylene-based resin (b2) thereby to have flexibility while suppressing the blocking when winding up the film. In addition, the resin composition (R4) contains the thermoplastic elastomer (b3) thereby to give the property of following irregularities to the second resin layer (B) and excellent chipping resistance can thus be obtained.

(2-2-1) Polyethylene-Based Resin (b2)

Specific examples of ethylene-based polymer of the polyethylene-based resin (b2) include a homopolymer of ethylene and ethylene copolymers, such as an ethylene/α-olefin copolymer, ethylene/vinyl acetate copolymer, ethylene/(meth)acrylic acid copolymer, and ethylene/(meth)acrylic ester copolymer. The ethylene-based polymer of the polyethylene-based resin (b2) may be composed of a homopolymer that comprises one type of monomer or may also be composed of a copolymer that comprises a plurality of types of monomers. Among the above, low-density polyethylene and linear low-density polyethylene may be preferred and linear low-density polyethylene may be particularly preferred.

The content ratio of constitutional units originated from ethylene in the ethylene-based polymer of the polyethylene-based resin (b2) may ordinarily be 70 mass % or more, preferably 70 to 99.9 mass %, more preferably 80 to 99 mass %, and particularly preferably 90 to 98 mass %, as a mass ratio of ethylene to the whole monomers for forming the copolymer. When the ethylene-based polymer of the polyethylene-based resin (b2) contains an ethylene copolymer of which the above mass ratio of ethylene falls within the above range, the flexibility suitable for expanding can be exhibited while suppressing the sticking of the resin itself.

Density of the ethylene-based polymer of the polyethylene-based resin (b2) (the "density" refers to a density at 23° C. unless otherwise stated in the present description) may preferably be 0.87 to 0.93 g/cm$^3$ and more preferably 0.89 to 0.92 g/cm$^3$. When the density of the ethylene-based polymer is 0.87 g/cm$^3$ or more, tack of the second resin layer (B) can be suppressed and the blocking can thus be effectively suppressed. When the density of the ethylene-based polymer is 0.93 g/cm$^3$ or less, the second resin layer (B) can exhibit excellent property of following irregularities and the chipping resistance of the base film 2 can thus be more excellent.

The polyethylene-based resin (b2) may preferably be a thermoplastic resin, in which case the ethylene-based polymer of the polyethylene-based resin (b2) may be in a state in which it is not crosslinked or the degree of crosslinking is appropriately controlled. When the polyethylene-based resin (b2) is a thermoplastic resin, the melt mass flow rate (MFR) when measured at a temperature of 190° C. and a load of 2.16 kgf (in accordance with JIS K7210-1999) may preferably be 0.5 to 10 g/10 min and more preferably 2.0 to 7.0 g/10 min.

When the polyethylene-based resin (b2) is a thermoplastic resin and crystalline, the melting peak temperature may preferably be 90° C. to 140° C. and more preferably 100° C. to 130° C. The melting heat quantity of the polyethylene-based resin (b2), which is a thermoplastic resin and crystalline, may preferably be 50 to 160 J/g. If the melting peak temperature of the polyethylene-based resin (b2) is lower than 90° C. and/or if the melting heat quantity is less than 50 J/g, the pressure sensitive adhesion property of the polyethylene-based resin (b2) alone will be excessively high and troubles (such as deterioration in the workability) may possibly occur when the resin composition for forming the second resin layer (B) is molded into a film-like shape. If the melting peak temperature of the polyethylene-based resin (b2) exceeds 140° C. and/or if the melting heat quantity exceeds 160 J/g, the crystallinity of the second resin layer (B) will possibly be beyond the previously-described range. The melting peak temperature and the melting heat quantity can be measured using a differential scanning calorimeter, as previously described.

The polyethylene-based resin (b2) may be one type of ethylene-based polymer or may also be a mixture of plural types of ethylene-based polymers.

The content of the polyethylene-based resin (b2) in the resin composition (R4) may preferably be 50 to 90 mass %, particularly preferably 55 to 85 mass %, and further preferably 60 to 80 mass %. When the content of the polyethylene-based resin (b2) is 50 mass % or more, the blocking when winding up the film and/or in a semiconductor working process can be suppressed while ensuring the flexibility. When the content of the polyethylene-based resin (b2) is 90 mass % or less, the content of the thermoplastic elastomer (b3) can be ensured to obtain more excellent chipping resistance.

(2-2-2) Thermoplastic Elastomer (b3)

Examples of the thermoplastic elastomer (b3) include olefin-based elastomer, polyester-based elastomer and styrene-based elastomer, among which olefin-based elastomer may be preferred.

As used in the present description, the "olefin-based elastomer" refers to a material that is a copolymer including constitutional units originated from olefin or its derivatives (olefin-based compounds) and has rubber-like elasticity within a temperature range including ordinary temperatures while having thermoplasticity.

Examples of the olefin-based elastomer include those that contain at least one type of resin selected from the group consisting of an ethylene/α-olefin copolymer, propylene/α-olefin copolymer, butene/α-olefin copolymer, ethylene/propylene/α-olefin copolymer, ethylene/butene/α-olefin copolymer, propylene/butene/α-olefin copolymer, ethylene/propylene/butene/α-olefin copolymer, styrene/isoprene copolymer, and styrene/ethylene/butylene copolymer. Among them, the ethylene/α-olefin copolymer may preferably be used in view of the use after being blended with the polyethylene-based resin (b2) and improving the property of following irregularities during the dicing.

In view of more stably obtaining the base film 2 excellent in the property of following irregularities during the dicing, the density of the olefin-based elastomer may be, but is not particularly limited to, preferably 0.860 g/cm$^3$ or more and less than 0.905 g/cm$^3$, more preferably 0.862 g/cm$^3$ or more and less than 0.900 g/cm$^3$, and particularly preferably 0.864 g/cm$^3$ or more and less than 0.895 g/cm$^3$.

In the olefin-based elastomer, the mass ratio of monomers of olefin-based compounds (also referred to as an "olefin content ratio," in the present description) may preferably be 60 to 100 mass % to the whole monomers used for forming the elastomer. If the olefin content ratio is excessively low, properties as those of elastomer that includes constitutional units originated from olefin will be difficult to appear and the flexibility and rubber-like elasticity may not be readily exhibited. In view of stably obtaining the effects of exhibiting such properties, the olefin content ratio may preferably be 60 mass % or more and more preferably 70 mass % or more.

The content of the thermoplastic elastomer (b3) in the resin composition (R4) may preferably be 10 to 50 mass %, particularly preferably 15 to 45 mass %, and further preferably 20 to 40 mass %. When the content of the thermoplastic elastomer (b3) is 5 mass % or more, more excellent chipping resistance can be ensured. When the content of the thermoplastic elastomer (b3) is 40 mass % or less, the content of the polyethylene-based resin (b2) can be ensured to more effectively suppress the blocking when winding up the film.

The resin composition (R4) can be obtained by melting and mixing the polyethylene-based resin (b2) and the thermoplastic elastomer (b3). The method of melting and mixing is the same as the previously-described method.

The resin composition (R4) may contain other polymers and/or various additives as in the resin composition (R3) in addition to the above two components (b2) and (b3).

(2-3) Thickness of Second Resin Layer (B)

The thickness of the second resin layer (B) may preferably be 30 to 120 μm and particularly preferably 40 to 100 μm. When the thickness of the second resin layer (B) is within the above range, excellent chipping resistance of the base film 2 can be effectively obtained.

In the present embodiment, the second resin layer (B) is composed of one resin layer, but the second resin layer (B) may also have a structure comprising a plurality of resin layers. In this case, each layer that constitutes the second resin layer (B) may have the previously-described physical properties and compositional features of the second resin layer (B).

(3) Other Physical Properties of Base Film

The fracture elongation of the base film 2 may preferably be 100% or more and particularly preferably 200% or more. The base film 2 having a fracture elongation of 100% or more is less likely to fracture during the expanding step and chips formed by cutting a cut object can be readily separated from one another.

The thickness of the base film 2 is not particularly limited, but may preferably be 50 to 400 μm in general, more preferably 50 to 300 μm, and particularly preferably 60 to 200 μm.

(4) Method of Manufacturing Base Film

The base film 2 may be manufactured by coextrusion molding in which film formation and lamination of the first resin layer (A) and second resin layer (B) are concurrently performed, or may also be manufactured by separately performing film formation of the first resin layer (A) and second resin layer (B) and thereafter laminating the first resin layer (A) and second resin layer (B) using an adhesive or the like. It may be preferred to manufacture the base film 2 by coextrusion molding in consideration of the simplicity of the manufacturing method and the interfacial adhesion between the first resin layer (A) and the second resin layer (B).

2. Pressure Sensitive Adhesive Layer

In the dicing sheet 1 according to the present embodiment, the pressure sensitive adhesive layer 3 is laminated so as to be in contact with the first resin layer (A) of the base film 2.

Examples of the pressure sensitive adhesive that constitutes the pressure sensitive adhesive layer 3 include, but are not limited to, those which are usually used for the dicing sheet 1, such as rubber-based, acrylic-based, epoxy-based, silicone-based and polyvinyl ether-based pressure sensitive adhesives, and energy ray curable-type (including ultraviolet curable-type) and heat curable-type pressure sensitive adhesives may also be used. When the dicing sheet 1 according to the present embodiment is used as a dicing/die-bonding sheet, appropriate adhesives may be used, such as pressure sensitive adhesive, thermoplastic adhesive and B-stage adhesive, which have both the wafer fixation function and die adhesion function.

The thickness of the pressure sensitive adhesive layer 3 is not particularly limited and may ordinarily be 3 to 100 μm and preferably 5 to 80 μm.

3. Other Constitutional Elements of Dicing Sheet

The dicing sheet 1 may further comprise other constitutional elements in addition to the base film 2 and the pressure sensitive adhesive layer 3. Examples of such other constitutional elements include a release sheet for protecting the surface of the pressure sensitive adhesive layer 3 which is not in contact with the first resin layer (A), that is, the surface to be attached to a cut object.

Examples of the release sheet to be used include, for example, a polyethylene film, polypropylene film, polybutene film, polybutadiene film, polymethylpentene film, polyvinyl chloride film, vinyl chloride copolymer film, polyethylene terephthalate film, polyethylene naphthalate film, polybutylene terephthalate film, polyurethane film, ethylene-vinyl acetate film, ionomer resin film, ethylene/(meth)acrylic acid copolymer film, ethylene/(meth)acrylic ester copolymer film, polystyrene film, polycarbonate film, polyimide film, and fluorine resin film. Crosslinked films thereof may also be used. The release sheet may be a laminate film obtained by laminating a plurality of such films.

It may be preferred that the release surface (surface at the side facing the pressure sensitive adhesive layer 3; surface having releasability from the pressure sensitive adhesive layer 3) of the above release sheet is subjected to release treatment. Examples of a release agent to be used for the release treatment include, for example, alkyd-based, silicone-based, fluorine-based, unsaturated polyester-based, polyolefin-based and wax-based release agents.

The thickness of the release sheet is not particularly limited and may ordinarily be about 20 to 150 μm.

4. Method of Manufacturing Dicing Sheet

The dicing sheet 1 according to the present embodiment can be manufactured by an ordinary method. For example, the dicing sheet 1 can be manufactured through preparing a coating agent that contains a material to constitute the pressure sensitive adhesive layer 3 and if necessary further contains some solvent, coating an exposed surface of the first resin layer (A) of the base film 2 with the coating agent using a coater such as roll coater, knife coater, knife-over-roll coater, air knife coater, die coater, bar coater, gravure coater and curtain coater, and drying the coating agent to form the pressure sensitive adhesive layer 3. In an alternative embodiment, the dicing sheet 1 can be manufactured through coating the release surface of a desired release sheet with the above coating agent, drying the coating agent to form the pressure sensitive adhesive layer 3, and attaching the side of the first resin layer (A) of the base film 2 to the pressure sensitive adhesive layer 3 by applying pressure.

5. Use Application of Dicing Sheet

The dicing sheet 1 according to the present embodiment can preferably be used as a dicing sheet that is used in the dicing step and expanding step for semiconductor wafers, BGA-type packages, etc.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

Figure 2:
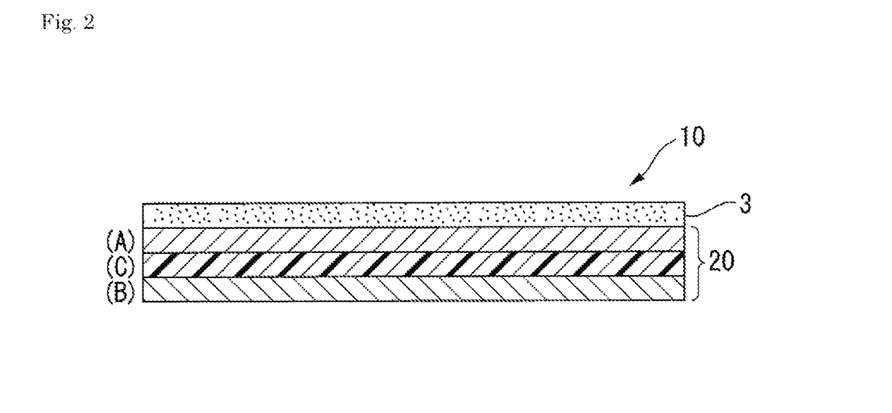
FIG. 2 is a cross-sectional view of a dicing sheet according to another embodiment of the present invention.

For example, as in a base film 20 of the dicing sheet 10 illustrated in FIG. 2, one or more other layers, for example, a third resin layer (C), may be laminated between the first resin layer (A) and the second resin layer (B).

In this case, it may be preferred that the tensile elastic modulus of the third resin layer (C) is not higher than the tensile elastic modulus of the first resin layer (A). This ensures excellent chipping resistance of the base film 2.

Material of the third resin layer (C) may preferably contain an olefin-based resin as in the first resin layer (A) and second resin layer (B) and may particularly preferably contain a polymer of which the constitutional monomer is ethylene. This can enhance the interfacial adhesion between the third resin layer (C) and the first resin layer (A) and second resin layer (B).

The thickness of the third resin layer (C) is not particularly limited, provided that the previously-described effects of the first resin layer (A) and second resin layer (B) are not impaired, but may preferably be 15% or less, particularly preferably 10% or less, and further preferably 5% or less, as a layer thickness ratio to the whole of the base film 20. The lower limit of the layer thickness ratio may ordinarily be 1% or more, which may be a thickness that allows the third resin layer (C) to exert its functionality.

EXAMPLES

Hereinafter, the present invention will be more specifically described with reference to examples, etc., but the scope of the present invention is not limited to these examples, etc.

《 Examples 1 to 8 and Comparative Examples 1 to 6 》

1. Production of Base Film
(1) Preparation of Raw Material for Extrusion of First Resin Layer (A)

Raw material for extrusion of each first resin layer (A) was obtained by mixing the raw materials below at compounding ratios (mass ratios) as listed in Table 1 and melting and kneading them using a biaxial kneading machine (Labo-Plastomill available from Toyo Seiki Seisaku-sho, LTD).

<Raw Materials for First Resin Layer (A)>

Ethylene-based copolymer (a1)-1: ethylene/methacrylic acid copolymer (ratio of constitutional units originated from ethylene: 91 mass %, ratio of constitutional units originated from methacrylic acid: 9 mass %, MFR at 190° C. and 2.16 kgf: 3.0 g/10 min)

Ethylene-based copolymer (a1)-2: ethylene/methacrylic acid copolymer (ratio of constitutional units originated from ethylene: 85 mass %, ratio of constitutional units originated from methacrylic acid: 15 mass %, MFR at 190° C. and 2.16 kgf: 60 g/10 min)

Ternary copolymer (a2): ethylene/glycidyl methacrylate/n-butyl acrylate copolymer (ratio of constitutional units originated from ethylene: 67 mass %, ratio of constitutional units originated from glycidyl methacrylate: 5 mass %, ratio of constitutional units originated from n-butyl acrylate: 28 mass %, MFR at 190° C. and 2.16 kgf: 12 g/10 min)

Polyolefin (a3)-1: homopolypropylene (Prime Polypro (registered trademark) F-113G available from Prime Polymer Co., Ltd., density: 0.91 g/cm$^3$, MFR at 230° C. and 2.16 kgf: 3.0 g/10 min)

Polyolefin (a3)-2: random polypropylene (Prime Polypro (registered trademark) F-219DA available from Prime Polymer Co., Ltd., density: 0.91 g/cm$^3$, MFR at 230° C. and 2.16 kgf: 8.0 g/10 min)

Ethylene/(meth)acrylic acid copolymer (a4): ethylene/methacrylic acid copolymer (Nucrel (registered trademark) NO903HC available from DUPONT-MITSUI POLYCHEMICALS CO., LTD., ratio of constitutional units originated from methacrylic acid: 9 mass %, tensile elastic modulus at 23° C.: 140 MPa)

Polypropylene-based resin (a5): ethylene/polypropylene random copolymer (Prime Polypro (registered trademark) F-227D available from Prime Polymer Co., Ltd., tensile elastic modulus at 23° C.: 950 MPa, MFR at 230° C. and 2.16 kgf: 7.0 g/10 min, melting peak temperature: 135° C., melting heat quantity: 81.9 J/g)

Norbornene-based resin: cycloolefin copolymer (TOPAS 7010 available from POLYPLASTICS CO., LTD., resin density at 23° C.: 1.02 g/cm$^3$, tensile elastic modulus at 23° C.: 2,100 MPa, liquefaction temperature: 142° C.)

(2) Preparation of Raw Material for Extrusion of Second Resin Layer (B)

Raw material for extrusion of each second resin layer (B) was obtained by melting and kneading the raw materials below at compounding ratios (mass ratios) as listed in Table 1 using a biaxial kneading machine (Labo-Plastomill available from Toyo Seiki Seisaku-sho, LTD).

<Raw Materials for Second Resin Layer (B)>

Ethylene-based copolymer (b1)-1: ethylene/methacrylic acid copolymer (Nucrel (registered trademark) NO903HC available from DUPONT-MITSUI POLYCHEMICALS CO., LTD., ratio of constitutional units originated from methacrylic acid: 9 mass %, tensile elastic modulus at 23° C.: 140 MPa)

Ethylene-based copolymer (b1)-2: ethylene/methacrylic acid copolymer (Nucrel (registered trademark) N1207C available from DUPONT-MITSUI POLYCHEMICALS CO., LTD., ratio of constitutional units originated from methacrylic acid: 12 mass %, tensile elastic modulus at 23° C.: 170 MPa)

Ethylene-based copolymer (b1)-3: ethylene/methacrylic acid copolymer (Nucrel (registered trademark) AN4214HC available from DUPONT-MITSUI POLYCHEMICALS CO., LTD., ratio of constitutional units originated from methacrylic acid: 4 mass %, tensile elastic modulus at 23° C.: 160 MPa)

Ethylene-based copolymer (b1)-4: linear low-density polyethylene (Umerit (registered trademark) 2540F available from Ube-Maruzen Polyethylene Co., Ltd., ratio of constitutional units originated from methacrylic acid: 0 mass %, resin density at 23° C.: 0.923 g/cm$^3$, tensile elastic modulus at 23° C.: 210 MPa)

Ethylene-based copolymer (b1)-5: ethylene/methacrylic acid copolymer (Nucrel (registered trademark) N1525 available from DUPONT-MITSUI POLYCHEMICALS CO., LTD., ratio of constitutional units originated from methacrylic acid: 15 mass %, tensile elastic modulus at 23° C.: 220 MPa)

Polyethylene-based resin (b2): linear low-density polyethylene (Evolue SP2040 available from Prime Polymer Co., Ltd., resin density: 0.918 g/cm$^3$, melting heat quantity ΔH: 124.1 J/g, tensile elastic modulus at 23° C.: 160 MPa, MFR at 190° C. and 2.16 kgf: 3.8 g/10 min)

Thermoplastic elastomer (b3): olefin-based elastomer (TPO) (Tafmer DF640 available from Mitsui Chemicals, Inc., resin density: 0.864 g/cm$^3$, melting heat quantity ΔH: 33.43 J/g, tensile elastic modulus at 23° C.: 4.5 MPa)

(3) Extrusion Molding of Resin Layers (Molding of Base Film)

The raw material for extrusion of each first resin layer (A) and the raw material for extrusion of each second resin layer (B) were subjected to coextrusion molding using a compact T-die extruder (Labo-plastomill available from Toyo Seiki Seisaku-sho, LTD.) and a base film of two-layer structure was obtained, comprising the first resin layer (A) and the second resin layer (B) having thicknesses (μm) as listed in Table 1. In Comparative Example 3, however, extrusion molding was performed using the above compact T-die extruder to obtain a base film of single layer having a thickness of 100 μm.

2. Preparation of Pressure Sensitive Adhesive

An energy ray curable-type pressure sensitive adhesive composition was obtained by mixing 100 mass parts of a copolymer (Mw: 500,000) provided by copolymerization of 95 mass parts of n-butyl acrylate and 5 mass parts of acrylic acid, 120 mass parts of urethane acrylate oligomer (Mw: 8,000), 5 mass parts of isocyanate-based curing agent (Coronate L available from NIPPON POLYURETHANE INDUSTRY CO., LTD.), and 4 mass parts of photopolymerization initiator (IRGACURE 184 available from Ciba Specialty Chemicals Inc).

3. Formation of Pressure Sensitive Adhesive Layer (Production of Dicing Sheet)

The obtained energy ray curable-type pressure sensitive adhesive composition was applied to the release treatment surface of a release sheet treated with silicone treatment (SP-PET38111(S) available from LINTEC Corporation) to have a film thickness after drying of 10 μm and dried at 100° C. for 1 minute to form a pressure sensitive adhesive layer, which was then attached to one surface of the above base film (surface at the side of the first resin layer (A)) thereby to transfer the pressure sensitive adhesive layer to the base film, and a dicing sheet was thus obtained.

《Exemplary Test 1》 <Measurement of Crystallinity>

The raw material for extrusion of the second resin layer (B) prepared in each of the examples and comparative examples was subjected to extrusion molding using a compact T-die extruder (Labo-plastomill available from Toyo Seiki Seisaku-sho, LTD.) and a resin film of single layer was obtained as a sample for measurement, comprising the second resin layer (B) having a thickness of 100 μm.

The above sample for measurement was heated at a heating rate of 20° C./min from the ordinary temperature to 250° C. and held at 250° C. for 10 minutes. Then, the sample was cooled at a cooling rate of 20° C./min to −60° C., held at −60° C. for 10 minutes, and thereafter heated again at a heating rate of 20° C./min to 250° C. to obtain a DSC curve with an endothermic peak area, from which the melting heat quantity (W/g) was obtained. The endothermic peak area was measured using a differential scanning calorimeter (DSC: available from TA Instruments). Then, from a value of the obtained melting heat quantity (W/g), the crystallinity was obtained using the equation below. Results are listed in Table 1.

Crystallinity(%)=(melting heat quantity/293)×100

《 Exemplary Test 2 》 <Measurement of Tensile Elastic Modulus>

The raw materials for extrusion of the first resin layer (A) and second resin layer (B) prepared in each of the examples and comparative examples were subjected respectively to extrusion molding using a compact T-die extruder (Labo-plastomill available from Toyo Seiki Seisaku-sho, LTD.) and single-layer resin films having a thickness of 100 μm were produced.

The single-layer resin films of the first resin layer (A) and second resin layer (B) obtained in the above and the base films produced in the examples and comparative examples were each cut into a test specimen of 15 mm (MD direction)×140 mm (CD direction) and the tensile elastic modulus at 23° C. was measured in accordance with JIS K7161: 1994 and JIS K7127: 1999. Specifically, tensile test was performed for the above test specimen with a rate of 200 mm/min using a tensile tester (Autograph AG-IS 500N available from SHIMADZU CORPORATION) after setting the distance between chucks at 100 mm, thereby to measure the tensile elastic modulus (MPa). The obtained measurement results were also used as the basis to calculate the ratio of a tensile elastic modulus of the first resin layer (A) to a tensile elastic modulus of the second resin layer (B) ((A)/(B)). Results are listed in Table 1.

《 Exemplary Test 3 》 <Dicing Process Suitability>

After attaching the pressure sensitive adhesive layer of the dicing sheet produced in each of the examples and comparative examples to a mirror wafer, they were set up on a dicing apparatus (DFD-6361 available from DISCO Corporation) and dicing was performed under the condition below:
  workpiece (adherend): mirror wafer;
  workpiece size: 12 inches diameter, 100 μm thickness;
  dicing blade: 27HECC available from DISCO Corporation;
  blade rotating speed: 30,000 rpm;
  dicing speed: 100 mm/sec;
  cutting depth: cutting into the base film with a depth of 20 μm from the interface with the pressure sensitive adhesive layer; and
  dicing size: 10 mm×10 mm.

From the results of performing the above dicing, the dicing process suitability was evaluated in accordance with the evaluation criteria below:
  A: dicing was able to be performed without troubles;
  B: the dicing sheet came into close contact with a suction table at the time of dicing and transport errors occurred; and
  C: after the dicing, fracture was confirmed at a part of the dicing sheet due to abnormal cutting.

Those falling under A and B were determined good (0: excellent dicing process suitability) and those falling under C were determined bad (x: poor dicing process suitability). Results are listed in Table 1.

《 Exemplary Test 4 》 <Evaluation of Dicing Debris>

After performing the dicing under the above dicing condition in Exemplary Test 3, the cut chips were removed by irradiating the base film side with ultraviolet rays (160 mJ/cm$^2$). Among lengthwise and breadthwise dicing lines, one lengthwise line and one breadthwise line located near the respective centers were subjected to a test in which the number of filament-like debris particles of a length of 100 μm or more generated on each line was counted using a digital microscope (VHX-100 available from KEYENCE CORPORATION, magnification: ×100). The counted number of filament-like debris particles was evaluated in accordance with the criteria below:
  A: the number of filament-like debris particles was 0 to 10;
  B: the number of filament-like debris particles was 11 to 15; and
  C: the number of filament-like debris particles was 16 or more.

Those falling under A and B were determined good (0: the generation of dicing debris was suppressed) and those falling under C were determined bad (x: the generation of dicing debris was not suppressed). Results are listed in Table 1.

《 Exemplary Test 5 》 <Evaluation of Chipping Resistance>

After performing the dicing under the above dicing condition in Exemplary Test 3, the cut chips were released by irradiating the base film side with ultraviolet rays (160 mJ/cm$^2$). Among lengthwise and breadthwise dicing lines around the back surfaces of the released chips, one lengthwise line and one breadthwise line were subjected to a test in which the length of the largest crack (chipping) occurring on each line was measured using a digital microscope (VHX-100 available from KEYENCE CORPORATION, magnification: ×100). On the basis of the measurement results, the chipping resistance was evaluated in accordance with the criteria below:
  A: the length of the crack of chip was less than 10 μm;
  B: the length of the crack of chip was 10 μm or more and less than 20 μm; and
  C: the length of the crack of chip was 20 μm or more.

Those falling under A and B were determined good (0: excellent chipping resistance) and those falling under C were determined bad (x: poor chipping resistance). Results are listed in Table 1.

《 Exemplary Test 6 》 <Evaluation of Blocking Resistance>

The base film (thickness of 100 μm and width of 300 mm) produced in each of the examples and comparative examples was wound up around a 3-inch core and used as a sample for test. This sample for test was stored in a dry oven set at a temperature of 70° C. for 24 hours and the film was then wound off using a winding-off machine. The situation at that time was evaluated in accordance with the criteria below:
  A: the film was able to be wound off without blocking;
  B: blocking occurred in a part or in whole, but the film was able to be wound off; and
  C: blocking occurred completely across the film and the film was not able to be wound off.

Those falling under A and B were determined good (0: excellent blocking resistance) and those falling under C were determined bad (x: poor blocking resistance). Results are listed in Table 1.

|  |  |  | Example 1 | Example 2 | Example 3 | Example 4 | Example 5 | Example 6 | Example 7 |
|---|---|---|---|---|---|---|---|---|---|
| First resin layer (A) | R1 | Ethylene-based copolymer (a1)-1 | Ethylene/methacrylic acid copolymer | — | — | — | — | — | 78.5 | — |
|  |  | Ethylene-based copolymer (a1)-2 | Ethylene/methacrylic acid copolymer | — | — | — | — | — | — | 80 |
|  |  | Ternary copolymer (a2) | Ethylene/glycidyl methacrylate/n-butyl acrylate copolymer | — | — | — | — | — | 1.5 | 5 |
|  |  | Polyolefin (a3)-1 | Homopolypropylene (Prime Polypro F-113G) | — | — | — | — | — | 20 | — |
|  |  | Polyolefin (a3)-2 | Random polypropylene (Prime Polypro F-219DA) | — | — | — | — | — | — | 15 |
|  | R2 | Ethylene/(meth)acrylic acid copolymer (a4) | Ethylene/methacrylic acid copolymer (Nucrel N0903HC, MAA9%) | 75 | 80 | 95 | 80 | 80 | — | — |
|  |  | Polypropylene-based resin (a5) | Random polypropylene (Prime Polypro F-227D) | 25 | 20 | 5 | 20 | 20 | — | — |
|  |  | Norbornene-based resin | Cycloolefin copolymer (TOPAS 7010) | — | — | — | — | — | — | — |
| Second resin layer (B) | R3 | Ethylene-based copolymer (b1)-1 | Ethylene/methacrylic acid copolymer (Nucrel N0903HC, MAA9%) | 100 | 100 | 100 | — | — | 100 | 100 |
|  |  | Ethylene-based copolymer (b1)-2 | Ethylene/methacrylic acid copolymer (Nucrel N1207C, MAA12%) | — | — | — | 100 | — | — | — |
|  |  | Ethylene-based copolymer (b1)-3 | Ethylene/methacrylic acid copolymer (Nucrel AN4214HC, MAA4%) | — | — | — | — | 100 | — | — |
|  |  | Ethylene-based copolymer (b1)-4 | Linear low-density polyethylene (Umerit 2540F, MAA0%) | — | — | — | — | — | — | — |
|  |  | Ethylene-based copolymer (b1)-5 | Ethylene/methacrylic acid copolymer (Nucrel N1525, MAA15%) | — | — | — | — | — | — | — |
|  | R4 | Polyethylene-based resin (b2) | Linear low-density polyethylene (Evolue SP2040) | — | — | — | — | — | — | — |
|  |  | Thermoplastic elastomer (b3) | Olefin-based elastomer (Tafmer DF640) | — | — | — | — | — | — | — |
| Layer structure |  |  | Number of layer(s) | 2 | 2 | 2 | 2 | 2 | 2 | 2 |
|  |  |  | Thickness of first resin layer (A) [μm] | 50 | 50 | 50 | 50 | 50 | 50 | 50 |
|  |  |  | Thickness of second resin layer (B) [μm] | 50 | 50 | 50 | 50 | 50 | 50 | 50 |
|  |  |  | Ratio of thickness of (A) [%] | 50 | 50 | 50 | 50 | 50 | 50 | 50 |
| Crystallinity of second resin layer (B) [%] |  |  |  | 33.8 | 33.8 | 33.8 | 30.1 | 38.8 | 33.8 | 33.8 |
| Tensile elastic modulus |  |  | First resin layer (A) [MPa] | 350 | 300 | 175 | 300 | 300 | 200 | 180 |
|  |  |  | Second resin layer (B) [MPa] | 140 | 140 | 140 | 170 | 160 | 140 | 140 |
|  |  |  | Ratio ((A)/(B)) | 2.50 | 2.10 | 1.25 | 1.76 | 1.88 | 1.40 | 1.30 |
|  |  |  | Base film [MPa] | 240 | 220 | 160 | 240 | 230 | 170 | 160 |
| Evaluation of blocking resistance |  |  |  | ○ (A) | ○ (A) | ○ (A) | ○ (B) | ○ (A) | ○ (A) | ○ (A) |
| Dicing process suitability |  |  |  | ○ (A) | ○ (A) | ○ (A) | ○ (A) | ○ (A) | ○ (A) | ○ (A) |
| Evaluation of dicing debris |  |  |  | ○ (A) | ○ (B) | ○ (B) | ○ (B) | ○ (B) | ○ (A) | ○ (A) |
| Evaluation of chipping resistance |  |  |  | ○ (A) | ○ (A) | ○ (B) | ○ (A) | ○ (A) | ○ (A) | ○ (A) |

|  |  |  | Example 8 | Comparative Example 1 | Comparative Example 2 | Comparative Example 3 | Comparative Example 4 | Comparative Example 5 | Comparative Example 6 |
|---|---|---|---|---|---|---|---|---|---|
| First resin layer (A) | R1 | Ethylene-based copolymer (a1)-1 | Ethylene/methacrylic acid copolymer | 78.5 | — | — | — | — | — | — |
|  |  | Ethylene-based copolymer (a1)-2 | Ethylene/methacrylic acid copolymer | — | — | — | — | — | — | — |
|  |  | Ternary copolymer (a2) | Ethylene/glycidyl methacrylate/n-butyl acrylate copolymer | 1.5 | — | — | — | — | — | — |
|  |  | Polyolefin (a3)-1 | Homopolypropylene (Prime Polypro F-113G) | 20 | — | — | — | — | — | — |
|  |  | Polyolefin (a3)-2 | Random polypropylene (Prime Polypro F-219DA) | — | — | — | — | — | — | — |

| | | | | | | | | | |
|---|---|---|---|---|---|---|---|---|---|
| | R2 | Ethylene/(meth)acrylic acid copolymer (a4) | Ethylene/methacrylic acid copolymer (Nucrel N0903HC, MAA9%) | — | 80 | 80 | 80 | 80 | 80 | 80 |
| | | Polypropylene-based resin (a5) | Random polypropylene (Prime Polypro F-227D) | — | 20 | 20 | 20 | 20 | 20 | — |
| | | Norbornene-based resin | Cycloolefin copolymer (TOPAS 7010) | — | — | — | — | — | — | 20 |
| Second resin layer (B) | R3 | Ethylene-based copolymer (b1)-1 | Ethylene/methacrylic acid copolymer (Nucrel N0903HC, MAA9%) | — | — | — | — | 100 | 100 | 100 |
| | | Ethylene-based copolymer (b1)-2 | Ethylene/methacrylic acid copolymer (Nucrel N1207C, MAA12%) | — | — | — | — | — | — | — |
| | | Ethylene-based copolymer (b1)-3 | Ethylene/methacrylic acid copolymer (Nucrel AN4214HC, MAA4%) | — | — | — | — | — | — | — |
| | | Ethylene-based copolymer (b1)-4 | Linear low-density polyethylene (Umerit 2540F, MAA0%) | — | 100 | — | — | — | — | — |
| | | Ethylene-based copolymer (b1)-5 | Ethylene/methacrylic acid copolymer (Nucrel N1525, MAA15%) | — | — | 100 | — | — | — | — |
| | R4 | Polyethylene-based resin (b2) | Linear low-density polyethylene (Evolue SP2040) | 70 | — | — | — | — | — | — |
| | | Thermoplastic elastomer (b3) | Olefin-based elastomer (Tafmer DF640) | 30 | — | — | — | — | — | — |
| Layor structure | | | Number of layer(s) | 2 | 2 | 2 | 1 | 2 | 2 | 2 |
| | | | Thickness of first resin layer (A) [μm] | 50 | 50 | 50 | 100 | 20 | 90 | 50 |
| | | | Thickness of second resin layer (B) [μm] | 50 | 50 | 50 | — | 80 | 10 | 50 |
| | | | Ratio of thickness of (A) [%] | 50 | 50 | 50 | 100 | 20 | 90 | 50 |
| Crystallinity of second resin layer (B) [%] | | | | 34.7 | 47.8 | 26.1 | — | 33.8 | 33.8 | 33.8 |
| Tensile elastic modulus | | | First resin layer (A) [MPa] | 200 | 300 | 300 | 300 | 300 | 300 | 480 |
| | | | Second resin layer (B) [MPa] | 160 | 210 | 220 | — | 140 | 140 | 140 |
| | | | Ratio ((A)/(B)) | 1.25 | 1.43 | 1.36 | 1.00 | 2.14 | 2.14 | 3.4 |
| | | | Base film [MPa] | 180 | 260 | 260 | 300 | 160 | 280 | 310 |
| Evaluation of blocking resistance | | | | ○ (A) | ○ (A) | x (C) | ○ (A) | ○ (A) | ○ (A) | ○ (A) |
| Dicing process suitability | | | | ○ (A) | ○ (A) | ○ (B) | ○ (A) | ○ (A) | ○ (A) | x (C) |
| Evaluation of dicing debris | | | | ○ (A) | ○ (B) | ○ (B) | ○ (B) | x (C) | ○ (B) | ○ (A) |
| Evaluation of chipping resistance | | | | ○ (A) | x (C) | ○ (A) | x (C) | x (C) | x (C) | ○ (A) |

As apparent from Table 1, in the base films produced in the examples, the occurrence of blocking is suppressed. Moreover, the dicing sheets produced in the examples are excellent in the dicing process suitability and the chipping resistance during the dicing step, and the dicing debris is less likely to be generated.

INDUSTRIAL APPLICABILITY

The base film for dicing sheets and dicing sheet according to the present invention can be preferably used for dicing of semiconductor wafers, various packages, etc.

DESCRIPTION OF REFERENCE NUMERALS 1, 10 . . . Dicing sheet
2 . . . Base film (resin layer (A)/resin layer (B))
20 . . . Base film (resin layer (A)/resin layer (C)/resin layer (B))
30 . . . Pressure sensitive adhesive layer

The invention claimed is:

1. A base film for dicing sheets, the base film including a first surface and a second surface, the base film capable of being used in a dicing sheet, the dicing sheet comprising the base film and an optional pressure sensitive adhesive layer laminated on the first surface of the base film, the base film comprising:
   a first resin layer that includes the first surface of the base film; and
   a second resin layer that has a crystallinity of 28% to 45% and that includes the second surface of the base film, wherein
   a ratio of a tensile elastic modulus of the first resin layer to a tensile elastic modulus of the second resin layer is 1.2 to 3.0,
   a ratio of a thickness of the first resin layer to a total thickness of the base film is 25% to 80%, and
   the first resin layer comprises a resin composition that contains a mixture of
   (i) an ethylene-based copolymer selected from the group consisting of an ethylene/α,β-unsaturated carboxylic acid copolymer and an ethylene/α,β-unsaturated carboxylic acid/α,β-unsaturated carboxylic ester copolymer,
   (ii) a ternary copolymer having a constitutional unit originated from α-olefin, a constitutional unit originated from glycidyl (meth)acrylate or glycidyl unsaturated ether and a constitutional unit originated from vinyl ester or unsaturated carboxylic ester, and
   (iii) a polyolefin.

2. The base film for dicing sheets as recited in claim 1, wherein
a further layer is laminated between the first resin layer and the second resin layer, and
the further layer has a tensile elastic modulus that is not higher than the tensile elastic modulus of the first resin layer.

3. The base film for dicing sheets as recited in claim 1, wherein at least the first resin layer and the second resin layer contain an olefin-based resin.

4. The base film for dicing sheets as recited in claim 1, wherein the second resin layer contains at least one polymer selected from the group consisting of a homopolymer of ethylene; a copolymer of ethylene/(meth)acrylic acid; a copolymer of ethylene/(meth)acrylic ester; and a copolymer of ethylene/(meth)acrylic acid/(meth)acrylic ester.

5. The base film for dicing sheets as recited in claim 1, wherein the ethylene-based copolymer is an ethylene/(meth)acrylic acid copolymer.

6. The base film for dicing sheets as recited in claim 1, wherein the ternary copolymer is an ethylene/glycidyl (meth)acrylate/alkyl acrylate ester copolymer.

7. The base film for dicing sheets as recited in claim 1, wherein the second resin layer contains an ethylene-based copolymer selected the group consisting of a copolymer of ethylene/(meth)acrylic acid; a copolymer of ethylene/(meth)acrylic ester; and a copolymer of ethylene/(meth)acrylic acid/(meth)acrylic ester.

8. The base film for dicing sheets as recited in claim 7, wherein the ethylene-based copolymer is an ethylene/(meth)acrylic acid copolymer.

9. The base film for dicing sheets as recited in claim 1, wherein the second resin layer comprises a resin composition that contains a polyethylene-based resin and a thermoplastic elastomer.

10. The base film for dicing sheets as recited in claim 1, wherein
the first resin layer has a tensile elastic modulus of 140 to 400 MPa, and
the second resin layer has a tensile elastic modulus of 100 to 290 MPa.

11. The base film for dicing sheets as recited in claim 1, wherein the base film for dicing sheets is formed by coextrusion molding.

12. A dicing sheet comprising:
the base film as recited in claim 1, and
the pressure sensitive adhesive layer laminated onto the first surface of the base film to form the dicing sheet in which the pressure sensitive adhesive layer directly contacts the first resin layer.

13. The base film for dicing sheets as recited in claim 1, wherein the base film is in a wound state in which the second surface overlaps with one or more portions of the first surface.

14. The base film for dicing sheets as recited in claim 1, wherein the second resin layer comprises a resin composition selected from the group consisting of (R3) an ethylene-based copolymer (b1) selected from the group consisting of a copolymer of ethylene/(meth)acrylic acid, a copolymer of ethylene/(meth)acrylic ester, and a copolymer of ethylene/(meth)acrylic acid/(meth)acrylic ester, and
(R4) a mixture of a polyethylene-based resin (b2) and a thermoplastic elastomer (b3).

15. A base film for dicing sheets, the base film including a first surface and a second surface, the base film capable of being used in a dicing sheet, the dicing sheet comprising the base film and an optional pressure sensitive adhesive layer laminated on the first surface of the base film, the base film comprising:
a first resin layer that includes the first surface of the base film; and
a second resin layer that has a crystallinity of 28% to 45% and that includes the second surface of the base film, wherein
a ratio of a tensile elastic modulus of the first resin layer to a tensile elastic modulus of the second resin layer is 1.2 to 3.0,
a ratio of a thickness of the first resin layer to a total thickness of the base film is 25% to 80%,
the first resin layer comprises a resin composition that contains a mixture of
(a1) an ethylene-based copolymer selected from the group consisting of an ethylene/α,β-unsaturated carboxylic acid copolymer and an ethylene/α,β-unsaturated carboxylic acid/α,β-unsaturated carboxylic ester copolymer,
(a2) a ternary copolymer having a constitutional unit originated from α-olefin, a constitutional unit originated from glycidyl (meth)acrylate or glycidyl unsaturated ether and a constitutional unit originated from vinyl ester or unsaturated carboxylic ester, and
(a3) a polyolefin, and
the second resin layer comprises a resin composition selected from the group consisting of
(R3) an ethylene-based copolymer, and
(R4) a mixture of a polyethylene-based resin (b2) and a thermoplastic elastomer (b3).

16. The base film for dicing sheets as recited in claim 15, wherein
a further layer is laminated between the first resin layer and the second resin layer, and
the further layer has a tensile elastic modulus that is not higher than the tensile elastic modulus of the first resin layer.

17. The base film for dicing sheets as recited in claim 15, wherein
the first resin layer has a tensile elastic modulus of 140 to 400 MPa, and
the second resin layer has a tensile elastic modulus of 100 to 290 MPa.

* * * * *